United States Patent [19]
Nowak

[11] Patent Number: 5,399,508
[45] Date of Patent: Mar. 21, 1995

[54] METHOD FOR SELF-ALIGNED PUNCHTHROUGH IMPLANT USING AN ETCH-BACK GATE

[75] Inventor: Edward D. Nowak, Pleasanton, Calif.

[73] Assignee: VLSI Technology, Inc., San Jose, Calif.

[21] Appl. No.: 81,993

[22] Filed: Jun. 23, 1993

[51] Int. Cl.⁶ .................................. H01L 21/265
[52] U.S. Cl. ................................. 437/27; 437/35; 437/44; 437/45; 437/28; 437/29; 437/983; 437/41
[58] Field of Search .................. 437/35, 34, 44, 45, 437/983, 27–29, 41

[56] References Cited

U.S. PATENT DOCUMENTS

| | | | |
|---|---|---|---|
| 4,325,747 | 4/1982 | Ristow | 148/1.5 |
| 5,061,975 | 10/1991 | Inuishi et al. | 357/23.4 |
| 5,073,512 | 12/1991 | Yoshino | 437/41 |
| 5,075,242 | 12/1991 | Nakahara | 437/34 |
| 5,212,542 | 5/1993 | Okumura | 257/369 |
| 5,217,910 | 6/1993 | Shimizu et al. | 437/35 |
| 5,219,777 | 6/1993 | Kang | 437/44 |

OTHER PUBLICATIONS

Wolf, S., "Silicon Processing for the VLSI ERA", Lattice Press, Sunset Beach, Calif., 1990, vol. 2, p. 27.

Primary Examiner—George Fourson
Assistant Examiner—David Mason
Attorney, Agent, or Firm—Patrick T. King

[57] ABSTRACT

A self-aligned MOSFET incorporating a punchthrough implant, and the method for forming such a transistor. A dielectric layer is used as a hard mask over a semiconductor substrate. A portion of the dielectric layer is removed to expose a region of the semiconductor substrate. A punchthrough implant is made with the remaining portion of the dielectric layer acting as a mask layer such that the doping concentration is raised by the punchthrough implant only in the exposed region of the semiconductor substrate. A doped layer of polysilicon is formed over the region into which the implant was made to provide a self-aligned gate over the highly doped region. A source and drain are formed on opposite sides of the doped region. A protective layer is formed over the device and metallized contacts are formed to the source, drain, and gate.

39 Claims, 4 Drawing Sheets

METHOD FOR SELF-ALIGNED PUNCHTHROUGH IMPLANT USING AN ETCH-BACK GATE

BACKGROUND OF THE INVENTION

1. Field of the Invention

The present invention relates to the field of fabrication of semiconductor transistors. Specifically, the present invention relates to the formation of MOS devices.

2. Prior Art

Metal-Oxide-Silicon, MOS, transistors such as Field Effect Transistors, MOSFETs, are well known in the art. Such devices are typically formed having a source region and a drain region, of similar conductivity type, separated by a channel region, of a differing conductivity type, capped with a conductive gate. The gate to source voltage controls the passage of current through the channel between the source and the drain regions. In typical n-channel operation, a positive voltage is applied between the drain and the source with the source grounded to a reference potential. Due to the differing conductivity type of the channel separating the source and the drain, usually no current flows between the source and drain. However, if a sufficiently large voltage is applied between the gate and source, the conductivity in the channel region will increase, thereby allowing current to flow between the source and the drain. The gate voltage required to induce the flow of current between the drain and the source is referred to as the threshold voltage.

Under certain circumstances, however, unwanted current flow may occur between the source and the drain even when no voltage is applied to the gate. Such a condition may be due to avalanche breakdown or punchthrough. Punchthrough occurs when the MOS transistor is biased in an off state with the gate and the source both at approximately zero volts with respect to ground, but with the drain at a voltage as high as 5 volts. Even though no flow of current is desired, drain current may still occur regardless of the zero gate voltage. This is due to the fact that under such conditions, the normal doping concentration of the channel region is not sufficient to prevent current flow between the source and drain regions.

In order to eliminate punchthrough currents, the doping concentration in the substrate of the MOS device is raised. A high energy or so-called "punchthrough" implant is used to locally raise the doping concentration of the MOS device substrate. Typically, the "punchthrough" implant is made as a blanket implant over the active region of the MOS device. Unfortunately, the punchthrough implant also raises the doping concentration of the substrate in the source and drain region. As a consequence of the increased doping concentration, the source-drain junction capacitance is also increased.

Furthermore, MOS semiconductor transistors, such as MOSFETs, often experience current leakage and other problems due to short channel lengths. The short channel, which occurs as a consequence of difficult to control manufacturing processes, results in closely spaced source and drain regions. Due to the close proximity of the source to the drain, current leakage or other "short channel" effects may hamper the performance of the semiconductor device.

Consequently, a need exists to prevent punchthrough effects in semiconductor devices such as MOSFETs using a high energy or punchthrough implant without substantially increasing source-drain junction capacitance, and which minimizes short channels effects.

SUMMARY OF THE INVENTION

One embodiment of the present invention provides a self-aligned semiconductor MOS transistor which minimizes punchthrough currents and short channel effects without increasing source-drain junction capacitance, and the method for forming such a transistor. This is accomplished by performing a punchthrough implant while using a dielectric layer as a hard mask to confine the region of the implant to only the channel region of the semiconductor device. In so doing, the doping concentration is increased by the punchthrough implant in the channel region without causing unwanted punchthrough implant overlap of the source or drain regions of the device. Furthermore, by increasing the doping concentration in the channel region, current leakage and other problems associated with short channel lengths are minimized.

Additionally, the present invention also provides a self-aligned gate formed over the doped channel region which allows the source and drain to be properly spaced so as to minimize short channel effects. The dielectric layer used to confine the punchthrough implant to the channel region of the device also allows the dimensions of the gate to be more precisely and easily controlled than was possible using standard gate formation processes.

In another embodiment of the present invention, a large tilt angle implanted drain, "LATID", technology is used to form the source region and drain regions of the MOSFET of the present invention. In such an embodiment, the source and drain regions are formed into the semiconductor substrate before the gate of the MOSFET is formed. By forming the source and drain regions with a LATID implant, the gate region can be formed fully overlapping a portion of both the source and drain region, thereby improving hot carrier reliability.

BRIEF DESCRIPTION OF THE DRAWINGS

The accompanying drawings which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1A:
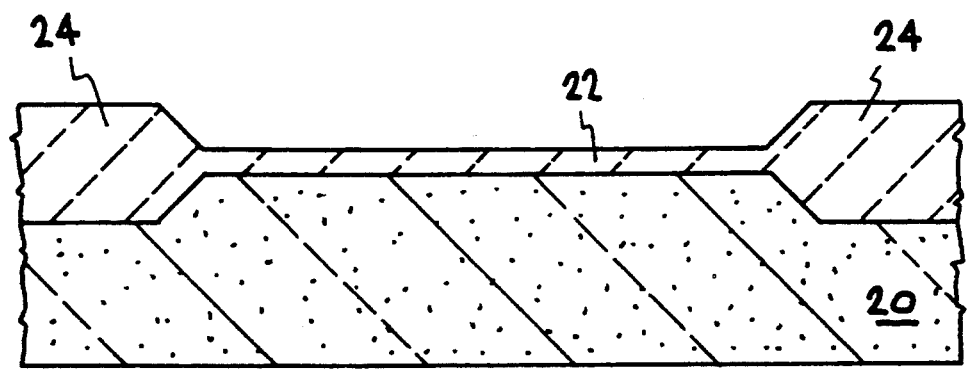
FIGS. 1A-J are side sectional views of a self-aligned MOS device illustrating the steps used in the fabrication of a self-aligned MOS device which incorporates a punchthrough implant in accordance with the present invention.

With reference to FIG. 1A, a cross-sectional view of the MOS device of the present invention is shown illustrating the starting step used in the fabrication of such a device. A p-doped silicon substrate 20, having a first sacrificial gate oxide layer 22 and field oxide layers 24 formed thereon, is shown. Although the p-doped silicon semiconductor substrate 20 is formed of silicon in the preferred embodiment, any other suitable semiconductor material may be used. Additionally, the substrate 20 may also have a different conductivity type if desired or may have been subsequently doped as in any standard CMOS type process. Although a MOSFET is formed in the present embodiment, the methods of the present invention are also well suited to other MOS devices. The first sacrificial gate oxide layer 22 is then removed from the semiconductor substrate 20. The first sacrificial gate oxide layer 22 may be etched from the substrate 20 using a plasma etch or any of the numerous etching techniques well known in the art. Furthermore, in the present preferred embodiment of the present invention, an n-MOS transistor is formed. However, the following description would also apply to the formation of a p-MOS type transistor by reversing the conductivity types of the dopants.

Figure 1B:
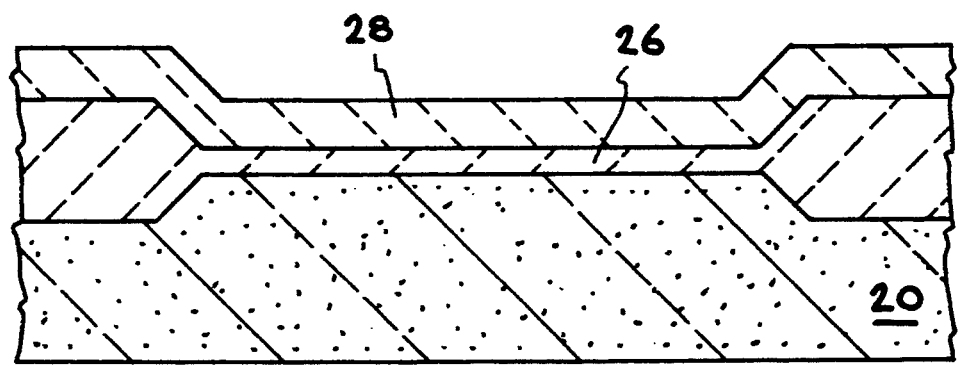

As shown in FIG. 1B, a second sacrificial gate oxide layer 26 is then grown over the semiconductor substrate 20. Note that by forming and removing the first sacrificial oxide layer as shown 22 in FIG. 1A, the semiconductor substrate 20 is better prepared for subsequent wafer fabrication processes. The sacrificial oxide is $SiO_2$ and is thermally grown. Next, a shielding layer 28 of dielectric material is deposited over the semiconductor substrate 20 such that second sacrificial gate oxide layer 26 is disposed between the semiconductor substrate 20 and the dielectric shielding layer 28. The dielectric shielding layer 28 is formed of silicon nitride in the present embodiment, however, any other dielectric shielding layer would also be suitable. Additionally, in this preferred embodiment of the present invention, the dielectric shielding layer 28 is deposited to a thickness of approximately 2000 to 5000 angstroms. Although the above-stated thickness is used in the preferred embodiment of the present invention, variations in the thickness of the dielectric shielding layer 28 may be made based on the needed gate length and/or shielding requirements.

Figure 1C:
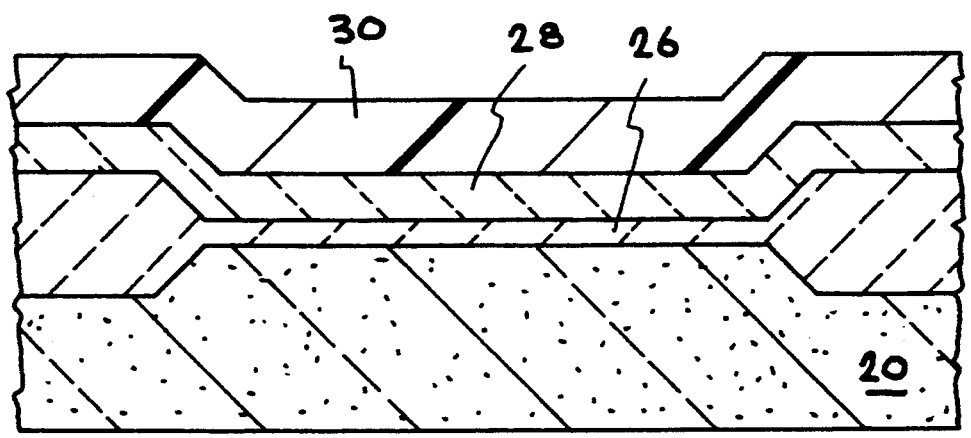

Referring now to FIG. 1C, a photoresist layer 30 of photoresist material is deposited over the dielectric shielding layer 28 such that the dielectric shielding layer 28 is disposed between the photoresist layer 30 and the second sacrificial gate oxide layer 26. Photoresist layer 30 is formed of a suitable photosensitive material and processed using standard techniques.

Figure 1D:
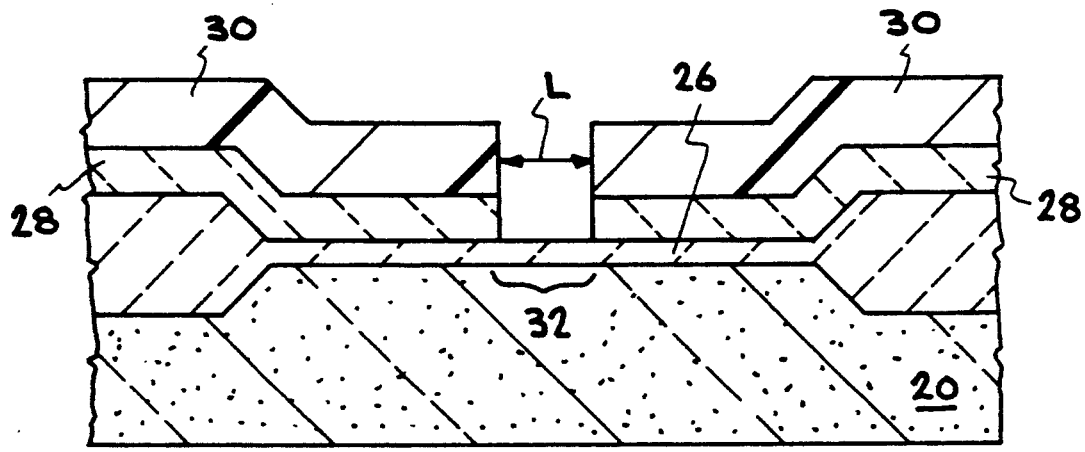

With reference now to FIG. 1D, a photomasking operation is used to selectively remove a portion of the photoresist layer 30 and the dielectric shielding layer 28 such that an area 32 of the semiconductor substrate 20 is covered only by the second sacrificial gate oxide layer 26. The area 32 extends lengthwise for a distance L across the semiconductor substrate 20.

Figure 1E:
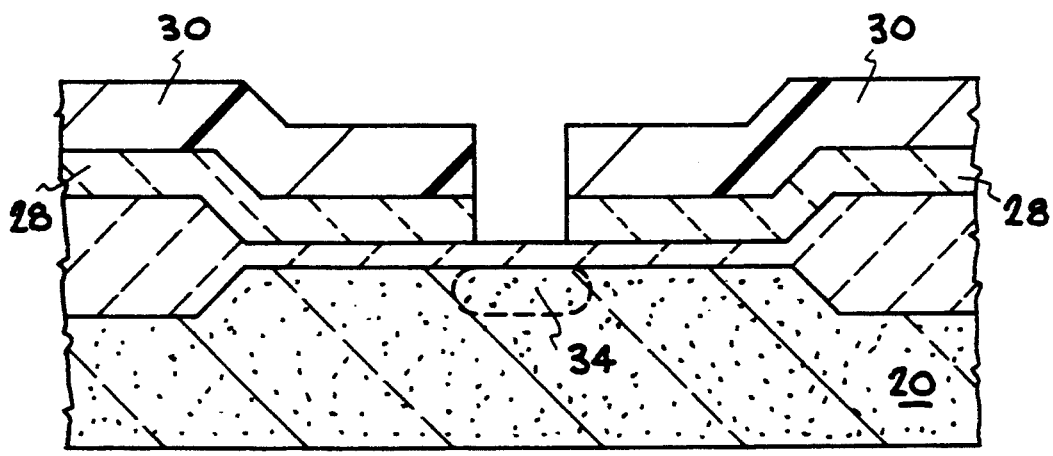

Referring now to FIG. 1E, a "punchthrough" implant and threshold voltage adjust implant are made with the remaining portion of the dielectric shielding layer 28 acting as a hard mask layer, and the photoresist layer 30 adding additional protection for the remaining covered portions of the substrate 20. In so doing, the doping concentration is raised by the punchthrough implant only in a localized region 34 of the semiconductor substrate 20. A dopant having the same conductivity type as the semiconductor substrate 20, which is p-type in one preferred embodiment of the present invention, is used for both the threshold voltage adjust and the punchthrough implant. Generally, the punchthrough implant will be of the same conductivity type as the substrate. The threshold voltage implant may have a differing conductivity type depending upon the need. For a typical CMOS process, however, the threshold voltage implant will be p-type for both n-channel and p-channel transistors. The punchthrough implant is made at high energy. In this preferred embodiment of the present invention, the punchthrough implant is made at an energy of at least 100 KeV, and preferably in the range of 100–150 KeV. Furthermore, although the voltage threshold adjust implant is made before the punchthrough implant, in a preferred embodiment of the present invention, the present invention is equally well suited to having the voltage threshold adjust implant made after the punchthrough implant.

With reference still to FIG. 1E, the doped region 34 functions as the channel of the MOS device of the present invention. Thus, the doping concentration of the substrate 20 is only increased in the channel region 34 of the device and not in the source and drain regions as found in prior semiconductor devices. Therefore, the present invention is able to minimize punchthrough and short channel effects by doping only the channel region 34 without substantially increasing the source-drain junction capacitance. This is in contrast to the prior art which uses a blanket punchthrough implant.

Figure 1F:
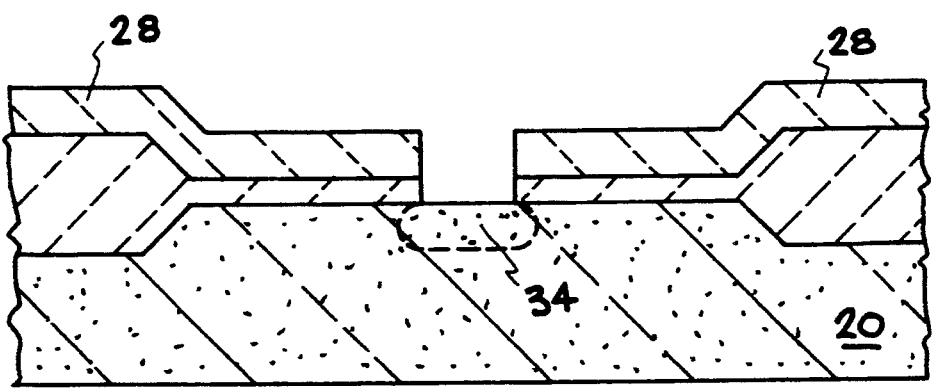

Referring next to FIG. 1F, the remaining portions of the photoresist layer 30 of FIG. 1E are removed, and the portion of the second sacrificial gate oxide layer 26 of FIG. 1E, which resides in the area above the channel region 34 of substrate 20, is removed. In a preferred embodiment of the present invention, the photoresist layer is not removed until after the punchthrough and voltage threshold adjust implant have been made so that the photoresist layer may provide additional protection for the substrate 20. However, the methods of the present invention are equally well suited to having the photoresist layer removed before the punchthrough and voltage threshold adjust implants are made.

Figure 1G:
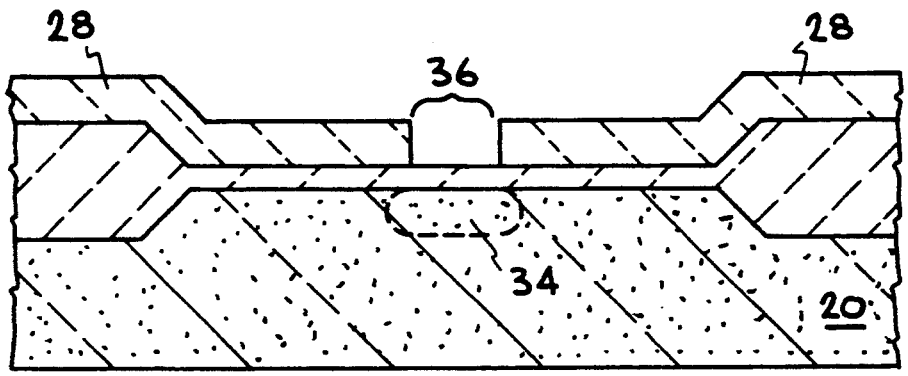

With reference now to FIG. 1G, a new portion 36 of a gate oxide layer is formed over the channel region 34, as illustrated.

Figure 1H:
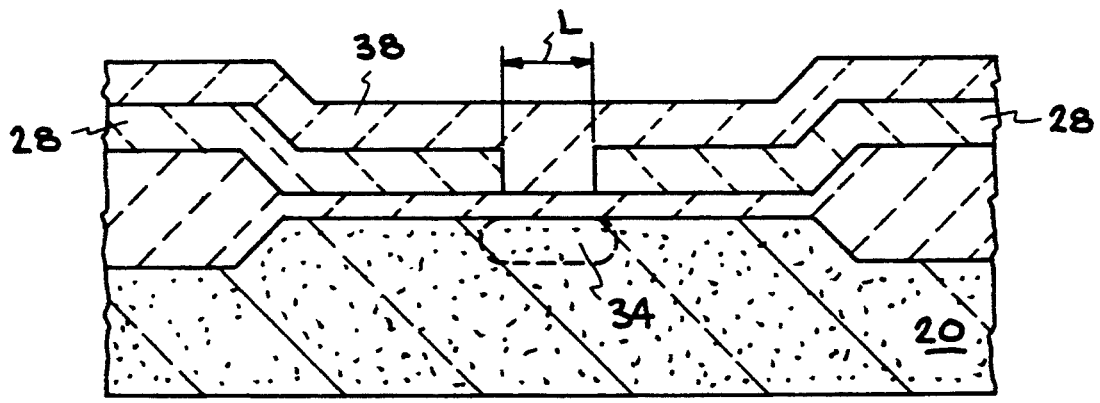

As shown in FIG. 1H, a layer of polysilicon 38 is formed over the channel region 34 and the dielectric layer 28. The polysilicon layer 38 is doped with a dopant having a conductivity which can be different from the conductivity of the substrate 20 and the channel region 34. In order to insure that polysilicon layer 38 fills in the volume above the channel region 34, the polysilicon layer 38 is formed having a depth which is, for example, at least half as great as the dimension L of the volume from which the dielectric layer has been etched.

Figure 1I:
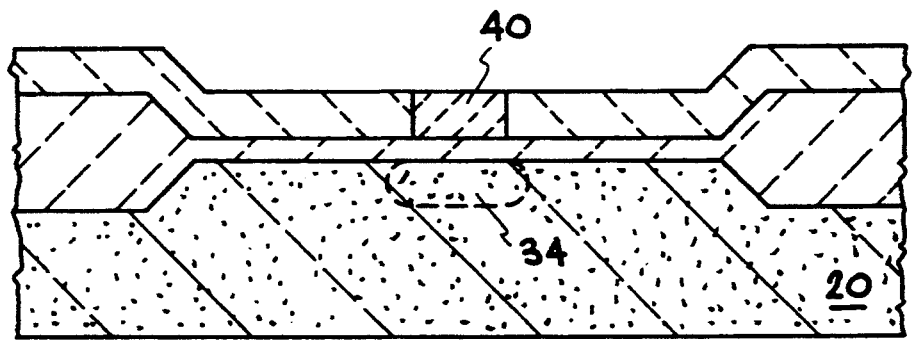

Referring now to FIG. 1I, the doped layer of polysilicon is selectively removed such that only that portion 40 of the polysilicon layer 38, residing in the area above channel region 34, is left. The portion 40 of polysilicon which remains after the removal process comprises the gate of the MOS device of the present invention. The polysilicon layer 38 is removed using an isotropic polysilicon etch process. A photomasking operation is used to define the polysilicon contact regions as well as other regions where polysilicon will remain. Therefore, the present invention provides a gate 40 which is self-aligned over the channel region 34 of substrate 20 wherein the punchthrough implant was made. Additionally, the size and shape of the gate 40 is defined by etching of the dielectric hard mask layer 28 and not by the more difficult to control methods of the prior art such as etching of polysilicon alone. Thus, the present invention provide a self-aligned gate 40. The present invention allows for easier fabrication of the gate. Additionally, the present invention provides for improved control of the dimensions of the gate.

Figure 1J:
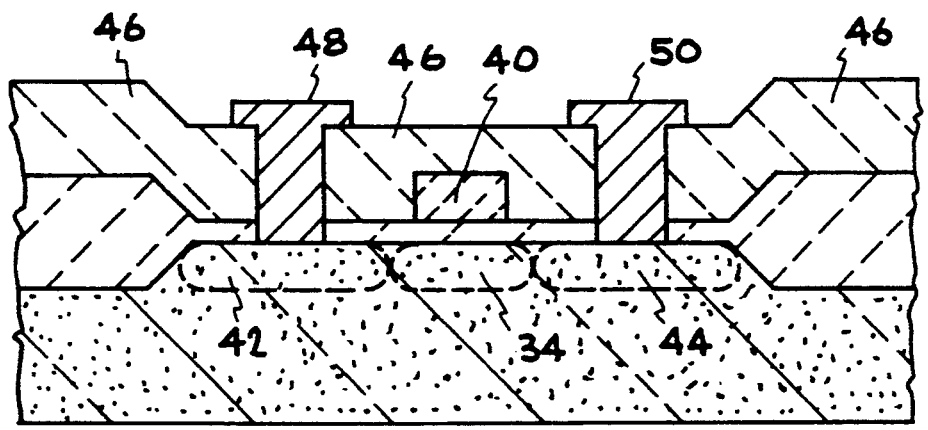

Referring next to FIG. 1J, the remaining portion of the dielectric shielding layer 28 of FIG. 1I is removed. Next, a source region 42 and a drain region 44 are formed on opposite sides of the channel region 34. Both the source and drain region have an n conductivity type. The source and drain regions may be formed using any of the numerous dopant implantation techniques well known in the art. A protective layer 46 of material such as, for example, silicate glass is then formed over the device and metallized contacts 48 and 50, are formed to the source 42, and to the drain 44, respectively. A metallized contact, not shown, is also formed to gate 40.

Figure 2A:
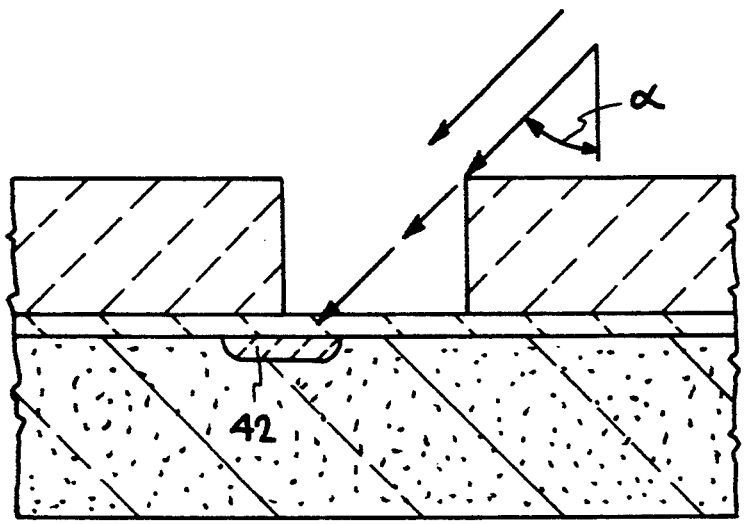
FIGS. 2A-B are side sectional views of a self-aligned MOS device illustrating the steps used in the fabrication of a self-aligned MOS device which incorporates a punchthrough implant and uses a LATID implant to form the source and drain regions in accordance with the present invention.
Figure 2B:
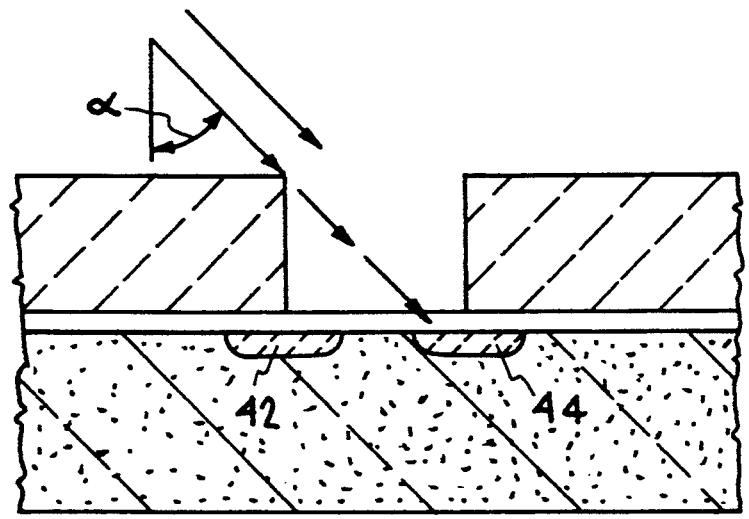

An alternative embodiment of the present invention is shown in FIGS. 2A–B. In this embodiment, the present invention is used in conjunction with large tilt angle implanted drain, LATID, technology. In such an embodiment, the source region 42 is formed as shown in FIG. 2A using an implant made at an angle α, and drain region 44 is made from the opposite side again at an angle α as shown in FIG. 2B. In such an embodiment, the processing steps are the same as in the embodiment of FIGS. 1A–1J, with the exception that the source region 42 and the drain region 44 are formed after the punchthrough and threshold voltage adjust implant have been made, and the photoresist layer of FIGS. 1C–E has been removed, but before the gate of the MOS device is formed. By forming the source and drain regions as shown in FIGS. 2A–B, the gate region is formed fully overlapping a portion of both the source and drain region, thereby improving hot carrier reliability.

The present invention as described above has several advantages over the prior art. By using the dielectric shielding layer 28 of FIG. 1B as a hard mask, the punchthrough implant can be localized to the channel region. As a result, punchthrough current and short channel effects are minimized without adversely increasing the source-drain junction capacitance as found in the prior art. Additionally, the present invention allows the dielectric mask layer 28 of FIG. 1B to be used to define the size and shape of MOS device gate, rather than having to control the size and shape using only the more difficult to control polysilicon layer 30 of FIG. 1C. Thus, fabrication of the gate structure is simplified while simultaneously providing for improved control over the dimensions of the gate.

The foregoing descriptions of specific embodiments of the present invention have been presented for the purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A method for forming a self-aligned MOS device consisting essentially of the steps of:
    forming a semiconductor substrate having a background conductivity, said background conductivity being of a first conductivity type,
    forming a first gate oxide layer over said semiconductor substrate,
    removing said first gate oxide layer from said semiconductor substrate,
    forming a second gate oxide layer over said semiconductor substrate,
    depositing a shielding layer over said semiconductor substrate such that said second gate oxide layer is disposed between said semiconductor substrate and said shielding layer,
    depositing a photoresist layer over said shielding layer such that said shielding layer is disposed between said photoresist layer and said second gate oxide layer,
    removing a portion of said photoresist layer and said shielding layer such that a first area of said semiconductor substrate is covered only by said second gate oxide layer, said first area extending in a lengthwise and widthwise direction across said semiconductor substrate,
    forming a first doped region having a higher doping concentration of said first conductivity type than said semiconductor substrate by;
        making a first implantation of a dopant of said first conductivity type into a first area of said semiconductor substrate, and
        making a second implantation of a dopant of said first conductivity type into said first area of said semiconductor substrate,
    removing said photoresist layer from said shielding layer,
    removing said second gate oxide layer from said first area of said semiconductor substrate,
    depositing or growing a third gate oxide layer over said first area of said semiconductor substrate,
    forming a gate electrode by depositing a single layer of polysilicon over said shielding layer and said third gate oxide layer covering said first doped region of said semiconductor substrate, said layer of polysilicon having a depth which is at least half as great as the distance through which said first area extends in said lengthwise direction across said semiconductor substrate,
    implanting a dopant of a second conductivity type into said layer of polysilicon,
    selectively removing said layer of polysilicon having said dopant of said second conductivity type implanted therein such that said layer of polysilicon remains over only said first area of said semiconductor substrate, and
    removing said shielding layer from said semiconductor substrate, forming a second doped region of a second conductivity type in said semiconductor substrate, said second doped region disposed on one side of said first doped region, forming a third doped region of said second conductivity type in said semiconductor substrate, said third doped region disposed on the other side of said first doped region such that said first doped region is disposed between said second and third doped regions, and forming electrical contacts through to said second doped region, said third doped region, and said gate electrode.

2. The method as recited in claim 1 wherein said step of forming electrical contacts to said second and third doped regions and said gate electrode further comprises the steps of:

forming a protective coating over the surface of said semiconductor substrate, opening contact holes through said protective coating, and forming metallized contacts extending through said contact holes, said metallized contacts electrically coupled to said second and third doped regions and said gate electrode.

3. The method as recited in claim 1 wherein said steps of doping with a dopant of said first conductivity type comprise the steps of doping with an n-type dopant, and said steps of doping with a dopant of said second conductivity type comprise the steps of doping with a p-type dopant.

4. The method as recited in claim 1 wherein said step of doping with a dopant of said first conductivity type comprise the steps of doping with a p-type dopant, and said steps of doping with a dopant of said second conductivity type comprise the steps of doping with an n-type dopant.

5. The method as recited in claim 2 wherein said step of forming said first and second gate oxide layer comprises forming layers of silicon dioxide.

6. The method as recited in claim 1 wherein said step of forming said third gate oxide layer comprises forming a layer of silicon dioxide.

7. The method as recited in claim 1 wherein said step of forming said shielding layer comprises forming a layer of a dielectric material.

8. The method as recited in claim 7 wherein said step of forming said shielding layer comprises forming a layer of a silicon nitride.

9. The method as recited in claim 8 wherein said step of forming said layer of silicon nitride layer comprises forming a layer of said silicon nitride having a depth in the range of approximately 2000–5000 angstroms.

10. The method as recited in claim 1 wherein step of removing said photoresist layer from said shielding layer comprises removing said photoresist layer using a photomasking operation.

11. The method as recited in claim 1 wherein said step of removing said photoresist layer from said shielding layer is completed before forming said first doped region.

12. The method as recited in claim 1 wherein said step of making said first implantation into said first doped region comprises making a threshold voltage adjust implant into said first doped region.

13. The method as recited in claim 1 wherein said step of making said second implantation into said first doped region comprises making a punchthrough implant into said first doped region.

14. The method as recited in claim 13 wherein said step of making a punchthrough implant into said first doped region comprises making a punchthrough implant at an energy of approximately 100 KeV or greater.

15. The method as recited in claim 1 wherein said step of making said first implantation into said first doped region comprises making a punchthrough implant into said first doped region.

16. The method as recited in claim 15 wherein said step of making a punchthrough implant into said first doped region comprises making a punchthrough implant at an energy of approximately 100 KeV or greater.

17. The method as recited in claim 1 wherein said step of making said second implantation into said first doped region comprises making a threshold voltage adjust implant into said first doped region.

18. The method as recited in claim 1 wherein said step of forming said second doped region comprises forming a source region of said self-aligned MOS device.

19. The method as recited in claim 1 wherein said step of forming said third doped region comprises forming a drain region of said self-aligned MOS device.

20. The method as recited in claim 1 wherein said step of forming said first doped region comprises forming a channel region of said self-aligned MOS device.

21. The method as recited in claim 1 wherein said second doped region is formed using a large tilt angle implanted drain (LATID) implant.

22. The method as recited in claim 1 wherein said third doped region is formed using a large tilt angle implanted drain (LATID) implant.

23. The method as recited in claim 1 wherein said steps of forming said self-aligned MOS device comprise forming a MOSFET.

24. A method for forming a self-aligned MOS device consisting essentially of the steps of:

forming a semiconductor substrate having a background conductivity, said background conductivity being of a first conductivity type, forming a first gate oxide layer over said semiconductor substrate, removing said first gate oxide layer from said semiconductor substrate, forming a second gate oxide layer over said semiconductor substrate, depositing a shielding layer over said semiconductor substrate such that said second gate oxide layer is disposed between said semiconductor substrate and said shielding layer, depositing a photoresist layer over said shielding layer such that said shielding layer is disposed between said photoresist layer and said second gate oxide layer, removing a portion of said photoresist layer and said shielding layer such that a first area of said semiconductor substrate is covered only by said second gate oxide layer, said first area extending in a lengthwise and widthwise direction across said semiconductor substrate, forming a first doped region having a higher doping concentration of said first conductivity type than said semiconductor substrate by;

making a first punchthrough implant of a dopant of said first conductivity into said first area of said semiconductor substrate, making a second threshold voltage adjust implant of a dopant of said first conductivity type into said first area of said semiconductor substrate, removing said photoresist layer from said shielding layer, removing said second gate oxide layer from said first area of said semiconductor substrate, depositing or growing a third gate oxide layer over said first area of said semiconductor substrate, forming a gate electrode by depositing a single layer of polysilicon over said shielding layer and said third gate oxide layer covering said doped region of said semiconductor substrate, said layer of polysilicon having a depth which is at least half as great as the distance through which said first area extends in said lengthwise direction across said semiconductor substrate, implanting a dopant of a second conductivity type into said layer of polysilicon, selectively removing said layer of polysilicon having said dopant of said second conductivity type implanted therein such that said layer of polysilicon remains over only said first area of said semiconductor substrate, removing said shielding layer from said semiconductor substrate, forming a source region for said self-aligned transistor in said semiconductor substrate, said source region disposed on one side of said first doped region, forming a drain region for said self-aligned transistor in said semiconductor substrate, said drain region disposed on the other side of said first doped region such that said first doped region is disposed between said source and drain regions, forming a protective coating over the surface of said semiconductor substrate, opening contact holes through said protective coating, forming electrical contacts through said holes in said protective coating to said source region, said drain region, and said doped polysilicon remaining over said first area of said semiconductor substrate.

25. The method as recited in claim 24 wherein said steps of doping with a dopant of said first conductivity type comprise the steps of doping with an n-type dopant, and said steps of doping with a dopant of said second conductivity type comprise the steps of doping with a p-type dopant.

26. The method as recited in claim 24 wherein said step of doping with a dopant of said first conductivity type comprise the steps of doping with a p-type dopant, and said steps of doping with a dopant of said second conductivity type comprise the steps of doping with an n-type dopant.

27. The method as recited in claim 24 wherein said steps of forming said first, second, and third gate oxide layers comprise forming layers of silicon dioxide.

28. The method as recited in claim 24 wherein said step of forming said shielding layer comprises forming a layer of a dielectric material.

29. The method as recited in claim 28 wherein said step of forming said shielding layer comprises forming a layer of a silicon nitride.

30. The method as recited in claim 29 wherein said step of forming said layer of silicon nitride layer comprises forming a layer of said silicon nitride having a depth in the range of approximately 2000–5000 angstroms.

31. The method as recited in claim 24 wherein said step of forming a photoresist layer comprises forming a layer of photoresistive material.

32. The method as recited in claim 24 wherein step of removing said photoresist layer from said shielding layer comprises removing said photoresist layer using a photomasking operation.

33. The method as recited in claim 24 wherein said step of removing said photoresist layer from said shielding layer is completed before forming said first doped region.

34. The method as recited in claim 24 wherein said step of making a punchthrough implant into said first doped region comprises making a punchthrough implant at an energy of approximately 100 KeV or greater.

35. The method as recited in claims 24 wherein said step of making said threshold voltage adjust implant is performed before said step of making said punchthrough implant.

36. The method as recited in claim 24 wherein said step of forming said first doped region comprises forming a channel region of said self-aligned MOS device.

37. The method as recited in claim 24 wherein said source region is formed using a large tilt angle implanted drain (LATID) implant.

38. The method as recited in claim 24 wherein said drain region is formed using a large tilt angle implanted drain (LATID) implant.

39. The method as recited in claim 24 wherein said steps of forming said self-aligned MOS device comprise forming a MOSFET.

* * * * *